United States Patent [19]

Andres

[11] Patent Number: 5,920,631
[45] Date of Patent: Jul. 6, 1999

[54] MULTIPLEX TRANSMISSION DEVICE FOR MULTIPLE-CHANNEL SIGNALS, ESPECIALLY MULTIPLE-CHANNEL AUDIO SIGNALS

[75] Inventor: Joerg Andres, Hannover, Germany

[73] Assignee: Sennheiser electronic GmbH & Co. KG, Wedemark, Germany

[21] Appl. No.: 08/852,618

[22] Filed: May 7, 1997

[30] Foreign Application Priority Data

May 10, 1996 [DE] Germany ............................ 196 19 003

[51] Int. Cl.⁶ .................................................. H04H 5/00
[52] U.S. Cl. ................................................. 381/2; 381/14
[58] Field of Search .................... 381/14, 16, 2, 381/1, 3

[56] References Cited

U.S. PATENT DOCUMENTS

| | | |
|---|---|---|
| 4,520,498 | 5/1985 | Hershberger ........................... 381/16 |
| 4,593,402 | 6/1986 | Parker ................................... 381/16 |
| 5,299,264 | 3/1994 | Schotz et al. ......................... 381/14 |
| 5,319,716 | 6/1994 | McGreevy .............................. 381/14 |

*Primary Examiner*—Vivian Chang
*Attorney, Agent, or Firm*—McAulay Nissen Goldberg Kiel & Hand, LLP

[57] ABSTRACT

A multiplex transmission device for multiple-channel signals, in particular multiple-channel audio signals, has a plurality of input channels, each of which receives an input signal, a multiplexer, the input channels being connected with the inputs of the multiplexer, and with an output channel which is connected to the output of the multiplexer for sending an output signal which is multiplexed from the input signals. A control element is connected in each input channel for controlling the amplitude of the respective input signal and a regulating device is provided for controlling the control elements. A special feature of the device consists in that the regulating device uses the output signal of the multiplexer as a regulating variable.

8 Claims, 1 Drawing Sheet

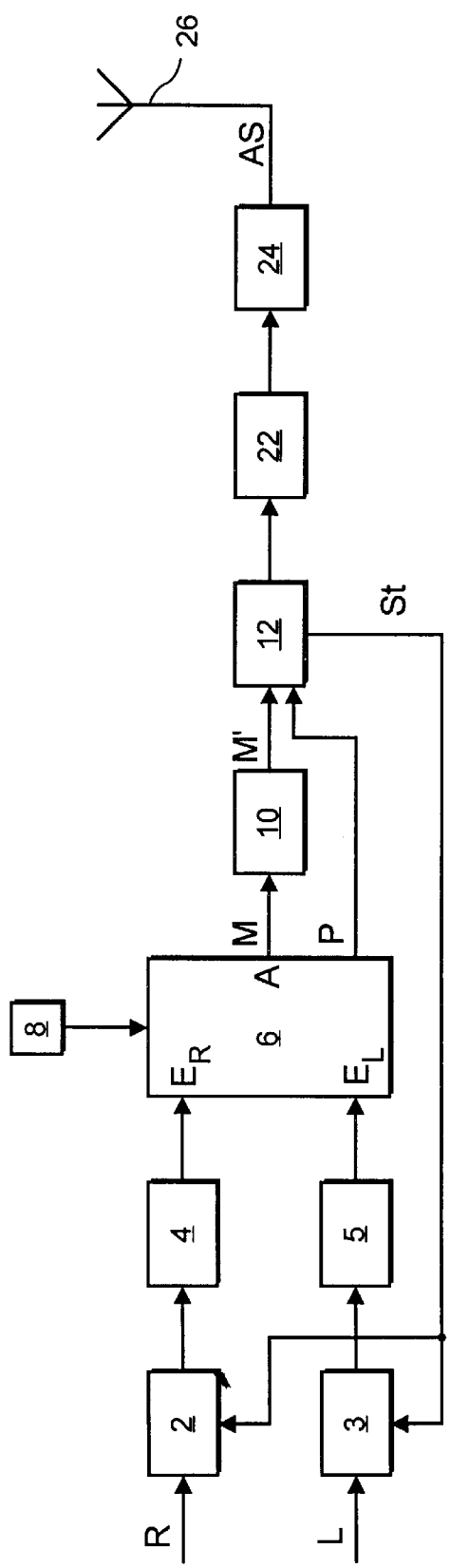
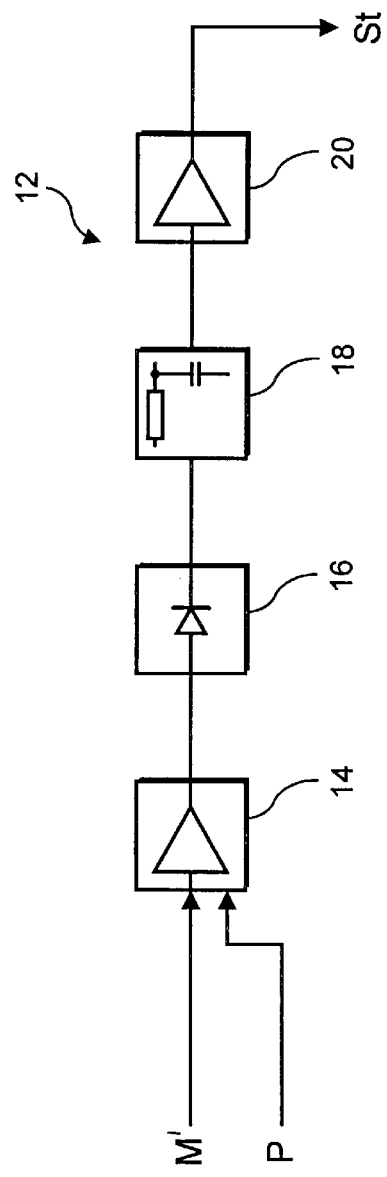
FIG. 1
FIG. 2

MULTIPLEX TRANSMISSION DEVICE FOR MULTIPLE-CHANNEL SIGNALS, ESPECIALLY MULTIPLE-CHANNEL AUDIO SIGNALS

BACKGROUND OF THE INVENTION a) Field of the Invention

The invention is directed to a multiplex transmission device for multiple-channel signals, in particular multiple-channel audio signals, with a plurality of input channels, each of which receives an input signal, with a multiplexer, the input channels being connected with the inputs of the multiplexer, and with an output channel which is connected to the output of the multiplexer for sending an output signal which is multiplexed from the input signals. A control element is connected in each input channel for controlling the amplitude of the respective input signal and a regulating device is provided for controlling the control elements.

A device of this kind is used particularly for amplitude regulation and/or amplitude limiting of stereophonic audio signals, in which case the multiplexer is then usually a stereo coder.

b) Description of the Related Art

In known devices of this type, regulation was relatively involved since it had to be carried out for each input channel separately. The construction of the known regulating device was also correspondingly complicated; known regulating devices provided separate regulating amplifiers, rectifiers and timing circuits for devices provided separate regulating amplifiers, rectifiers and timing circuits for each individual input channel, although this could result in differential level errors. There was also an alternative construction, for example, with separate regulating amplifiers and rectifiers for each individual input channel and subsequent summation of the output signals of the rectifiers for a timing circuit.

OBJECT AND SUMMARY OF THE INVENTION

It is the primary object of the present invention, therefore, to simplify the design of the regulating device in a transmission device of the type mentioned above without diminishing its effect.

This object is met in that the regulating device in an arrangement of the type mentioned above uses the output signal of the multiplexer as a regulating variable.

According to the invention, the multiplex signal of the multiplexer, as output signal, is used as a regulating variable for regulating and/or limiting the amplitude of the input signals. In so doing, the invention makes use of the idea that the output signal of the multiplexer contains the amplitude information of the input signals of all input channels. Thus, according to the invention, only one individual regulating device with an individual input for inputting the regulating variable is needed in order to regulate the amplitude of the input signals of all input channels.

The invention offers economic advantages since only one individual regulating device is used, resulting in savings on material. The invention is also advantageous as regards frequency sweep or frequency shift; that is, since the multiplex signal is used as a regulating variable, single-channel control, for example, will have the same frequency shift as multiple-channel control.

Accordingly, the regulating device preferably generates an individual control signal by which all control elements are controlled simultaneously.

In another preferred construction, the regulating device has an amplifier for generating the control signal. A timing circuit can be connected to this amplifier, wherein a rectifier can also be connected between the amplifier and the timing circuit.

Further, the regulating device can preferably have a buffer for temporary storage of the generated control signal.

When an embodiment of the invention is provided for the transmission of stereophonic audio signals, the multiplexer will be a commercially available stereo coder.

A preferred construction of the invention will be described more fully hereinafter with reference to the accompanying figures.

BRIEF DESCRIPTION OF THE DRAWINGS

In the drawings:

FIG. 1 is a block diagram showing a stereo multiplexing transmitter circuit; and FIG. 2 is a block diagram showing the regulating circuit contained in the transmitter circuit according to FIG. 1.

DESCRIPTION OF THE PREFERRED EMBODIMENTS

The stereo multiplexing transmitter circuit shown in FIG. 1 has two input channels, namely, a first, right input channel for the right audio signal R and a second, left input channel for-the left audio signal L. The right audio signal R is inputted in an input stage 2 with controllable amplification and forwarded to a preamplifier 4 connected downstream. The left audio input signal L is accordingly inputted into an input stage 3 with controllable amplification and conveyed to a preamplifier 5. The two output signals of the preamplifiers 4, 5 are sent to inputs $E_R$ and $E_L$ of a stereo coder 6 which is constructed as a multiplexer and controlled by an oscillator 8 connected thereto. At its output A, the stereo coder 6 generates an output signal M which is multiplexed from the two input signals R and L and is fed through a low-pass filter 10 to a regulating circuit 12. In addition to the output signal M' of the low-pass filter 10 connected upstream, the pilot signal P of the stereo coder 6 is also inputted in the regulating circuit 12.

FIG. 2 is a block diagram showing the internal construction of the regulating circuit 12 in detail. According to this figure, the regulating circuit 12 has a regulating amplifier 14 which receives, as input signal, the output signal M' of the low-pass filter 10 and, in addition, the pilot signal P, although it is optional whether or not to provide the latter. The output signal of the regulating amplifier 14 is rectified in a rectifier 16 connected downstream and is delayed in a timing circuit 18 connected with the latter and is transmitted via a buffer 20 as a control signal St to both input amplifier stages 2 and 3. With the help of the control signal St, the regulating circuit 12 influences the amplification of the input stages 2 and 3. The multiplex signal M' transmitted by the stereo coder 6 and, in the present case, through a low-pass filter is accordingly used by the regulating circuit 12 as a regulating variable.

The useful signal is transmitted from the regulating circuit 12 to a HF oscillator 22 and is then conveyed to a HF output stage 24 so that it can be transmitted via an antenna 26 as an antenna signal As.

In conclusion, it is noted that a circuit other than that shown in FIG. 2 can also be used as a regulating circuit.

While the foregoing description and drawings represent the preferred embodiments of the present invention, it will be obvious to those skilled in the art that various changes and modifications may be made therein without departing from the true spirit and scope of the present invention.

What is claimed is:

1. A multiplex transmission device for multiple-channel signals, in particular multiple-channel audio signals comprising:
   a plurality of input channels, each of which receives an input signal;
   a multiplexer having inputs and an output;
   said input channels being connected with the inputs of said multiplexer;
   an output channel which is connected to said output of the multiplexer for sending an output signal which is multiplexed from the input signals;
   a control element being connected in each input channel for controlling the amplitude of the respective input signal; and
   a regulating device being provided for controlling the control elements; said regulating device using said output signal of said multiplexer as a regulating variable.

2. The device according to claim 1, wherein the regulating device generates an individual control signal by which all control elements are controlled simultaneously.

3. The device according to claim 1, wherein the regulating device has an amplifier for generating the control signal.

4. The device according to claim 3, wherein a timing circuit is connected to the amplifier.

5. The device according to claim 4, wherein a rectifier is connected between the amplifier and the timing circuit.

6. The device according to claim 1, wherein the regulating device has a buffer for temporary storage of the generated control signal.

7. The device according to claim 1 for stereophonic audio signals, with two input channels, wherein the multiplexer is a stereo coder.

8. A multiplex transmission device for stereophonic audio signal comprising:
   a pair of input channels, each of which receiving a stereo input signal;
   a stereo coder having a pair of inputs and an output;
   said input channels being connected with the inputs of the stereo coder;
   an output channel which is connected to said output of said stereo coder for sending an output signal which is multiplexed from the input signals;
   a control element being connected in each input channel for controlling the amplitude of the respective input signal; and
   a regulating device being provided for controlling the control elements; said regulating device using said output signal of said stereo coder as a regulating variable.

* * * * *